United States Patent
Ha

(10) Patent No.: US 10,403,660 B2
(45) Date of Patent: Sep. 3, 2019

(54) IMAGE SENSOR AND METHOD OF MANUFACTURING THE SAME

(71) Applicant: DB HITEK CO., LTD., Gangnam-gu, Seoul (KR)

(72) Inventor: Man Lyun Ha, Mungyeong-si (KR)

(73) Assignee: DB HITEK CO., LTD., Seoul (KR)

(*) Notice: Subject to any disclaimer, the term of this patent is extended or adjusted under 35 U.S.C. 154(b) by 0 days.

(21) Appl. No.: 15/989,600

(22) Filed: May 25, 2018

(65) Prior Publication Data

US 2018/0342548 A1   Nov. 29, 2018

(30) Foreign Application Priority Data

May 26, 2017 (KR) .................. 10-2017-0065018

(51) Int. Cl.
| | | |
|---|---|---|
| *H01L 21/00* | (2006.01) | |
| *H01L 27/146* | (2006.01) | |
| *H01L 21/3115* | (2006.01) | |
| *H01L 21/02* | (2006.01) | |
| *H04N 5/374* | (2011.01) | |

(52) U.S. Cl.
CPC .. *H01L 27/14614* (2013.01); *H01L 21/02321* (2013.01); *H01L 21/3115* (2013.01); *H01L 27/14643* (2013.01); *H01L 27/14689* (2013.01); *H01L 27/14698* (2013.01); *H04N 5/374* (2013.01)

(58) Field of Classification Search
None
See application file for complete search history.

(56) References Cited

U.S. PATENT DOCUMENTS

| | | | |
|---|---|---|---|
| 6,191,463 B1* | 2/2001 | Mitani | .............. H01L 21/28176 257/410 |
| 9,270,232 B2 | 2/2016 | Park et al. | |
| 9,538,111 B2 | 1/2017 | Yang et al. | |
| 2014/0264507 A1 | 9/2014 | Lee et al. | |
| 2015/0123178 A1* | 5/2015 | Nishida | .............. H01L 27/14614 257/292 |

FOREIGN PATENT DOCUMENTS

| | | |
|---|---|---|
| KR | 10-2013-0059995 | 6/2013 |
| KR | 10-2015-0075896 | 7/2015 |

* cited by examiner

*Primary Examiner* — Reema Patel
(74) *Attorney, Agent, or Firm* — Patterson Thuente Pedersen, P.A.

(57) ABSTRACT

An image sensor and a method of manufacturing the same are disclosed. The image sensor includes a photodiode disposed in a substrate, and transistors disposed on the substrate and electrically connected with the photodiode. A gate insulating layer of a source follower transistor among the transistors includes fluorine so as to remove defects such as dangling bonds.

15 Claims, 5 Drawing Sheets

IMAGE SENSOR AND METHOD OF
MANUFACTURING THE SAME

CROSS-REFERENCE TO RELATED
APPLICATION

This application claims the priority benefit of Korean Patent Application No. 10-2017-0065018, filed on May 26, 2017, and all the benefits accruing therefrom under 35 U.S.C. § 119, the contents of which are incorporated by reference in their entirety.

BACKGROUND

The present disclosure relates to an image sensor and a method of manufacturing the same. More specifically, the present disclosure relates to a complementary metal oxide semiconductor (CMOS) image sensor having a reduced noise and a method of manufacturing the same.

In general, an image sensor is a semiconductor device that converts an optical image into electrical signals, and may be classified or categorized as a charge coupled device (CCD) or a CMOS image sensor (CIS).

The CMOS image sensor includes unit pixels, each including a photodiode and MOS transistors. The CMOS image sensor sequentially detects the electrical signals of the unit pixels using a switching method, thereby forming an image.

The CMOS image sensor may include photodiodes formed in a substrate, transistors formed on the substrate, wiring layers electrically connected with the transistors, and a color filter layer and micro lens array formed on the wiring layers.

Particularly, the CMOS image sensor may include pixel regions arranged in rows and columns, and each of the pixel regions may include a photodiode and a plurality of transistors electrically connected with the photodiode. For example, each pixel region may include a transfer transistor, a reset transistor, a source follower transistor and a select transistor electrically connected with the photodiode. Further, the CMOS image sensor may include a programmable gain amplifier (PGA), a correlated double sampling (CDS) circuit and an analog digital converter (ADC) in order to convert analog signals output from the pixel regions into digital signals.

Often, when defects such as dangling bonds are formed in a gate insulating layer of the source follower transistor connected with a floating diffusion region of the pixel region, the dangling bonds may function as electron trap sites, and thus temporal noise such as flicker noise (1/f Noise) may be generated. Further, when the dangling bonds are formed in gate insulating layers of amplifying transistors of the PGA and/or CDS circuit, flickering column noise may be generated.

SUMMARY

The present disclosure provides an image sensor capable of reducing temporal noise such as flicker noise and a method of manufacturing the image sensor.

In accordance with an aspect of the present disclosure, an image sensor may include a photodiode disposed in a substrate, and a plurality of transistors, including a source follower transistor, disposed on the substrate and electrically connected with the photodiode. A gate insulating layer of a source follower transistor may include fluorine.

In accordance with some exemplary embodiments of the present disclosure, gate insulating layers of the transistors other than the source follower transistor do not include fluorine.

In accordance with some exemplary embodiments of the present disclosure, at least one of the plurality of transistors may be a select transistor, and the image sensor may further include a programmable gain amplifier electrically connected with the select transistor that includes at least one amplifying transistor. The gate insulating layers of amplifying transistors of the programmable gain amplifier may include fluorine.

In accordance with some exemplary embodiments of the present disclosure, at least one of the plurality of transistors may be a select transistor, and the image sensor may further include a correlated double sampling circuit electrically connected with the select transistor that includes at least one amplifying transistor. The gate insulating layers of amplifying transistors of the correlated double sampling circuit may include fluorine.

In accordance with another aspect of the present disclosure, a method of manufacturing an image sensor may include forming a photodiode in a substrate, and forming a plurality of transistors on the substrate, the each of the plurality of transistors being electrically connected with the photodiode. A gate insulating layer of a source follower transistor among the transistors may include fluorine.

In accordance with some exemplary embodiments of the present disclosure, gate insulating layers of the transistors other than the source follower transistor do not comprise fluorine.

In accordance with some exemplary embodiments of the present disclosure, the method may further include forming a programmable gain amplifier on the substrate. The programmable gain amplifier may be electrically connected with a select transistor among the transistors, and amplifying transistors of the programmable gain amplifier may be simultaneously formed with the source follower transistor. The gate insulating layers of the amplifying transistors of the programmable gain amplifier may include fluorine.

In accordance with some exemplary embodiments of the present disclosure, the method may further include forming a correlated double sampling circuit on the substrate. The correlated double sampling circuit may be electrically connected with a select transistor among the transistors, and amplifying transistors of the correlated double sampling circuit may be simultaneously formed with the source follower transistor. The gate insulating layers of the amplifying transistors of the correlated double sampling circuit may include fluorine.

In accordance with still another aspect of the present disclosure, a method of manufacturing an image sensor may include forming a photodiode in a substrate, forming an insulating layer on the substrate, forming a conductive layer on the insulating layer, selectively implanting fluorine into at least a portion of the conductive layer, and forming gate electrodes and gate insulating layers of a plurality of transistors, including a source follower transistor, by patterning the conductive layer and the insulating layer. The transistors may be electrically connected with the photodiode, and the portion of the conductive layer into which the fluorine is implanted may be formed into a gate electrode of a source follower transistor among the transistors.

In accordance with some exemplary embodiments of the present disclosure, the fluorine may be selectively implanted only into a portion of the conductive layer where the gate electrode of the source follower transistor is to be formed.

In accordance with some exemplary embodiments of the present disclosure, the method may further include performing a heat treatment to diffuse the implanted fluorine into the gate insulating layer of the source follower transistor.

In accordance with some exemplary embodiments of the present disclosure, the method may further include forming impurity diffusion regions in surface portions of the substrate adjacent to the gate electrodes.

In accordance with some exemplary embodiments of the present disclosure, the forming impurity diffusion regions may include implanting impurities into the surface portions of the substrate, and performing a heat treatment to activate the implanted impurities. The implanted fluorine may be diffused into a gate insulating layer of the source follower transistor during the heat treatment.

In accordance with some exemplary embodiments of the present disclosure, gate electrodes and gate insulating layers of a plurality of amplifying transistors may be formed by patterning the conductive layer and the insulating layer. The amplifying transistors may be electrically connected with a select transistor among the transistors, and the fluorine may be implanted into portions of the conductive layer where the gate electrodes of the amplifying transistors are to be formed.

In accordance with some exemplary embodiments of the present disclosure, the amplifying transistors may constitute a programmable gain amplifier electrically connected with the select transistor.

In accordance with some exemplary embodiments of the present disclosure, the amplifying transistors may constitute a correlated double sampling circuit electrically connected with the select transistor.

The above summary of the present disclosure is not intended to describe each illustrated embodiment or every implementation of the present disclosure. The detailed description and claims that follow more particularly exemplify these embodiments.

BRIEF DESCRIPTION OF THE DRAWINGS

Exemplary embodiments can be understood in more detail from the following description taken in conjunction with the accompanying drawings, in which.

Figure 1:
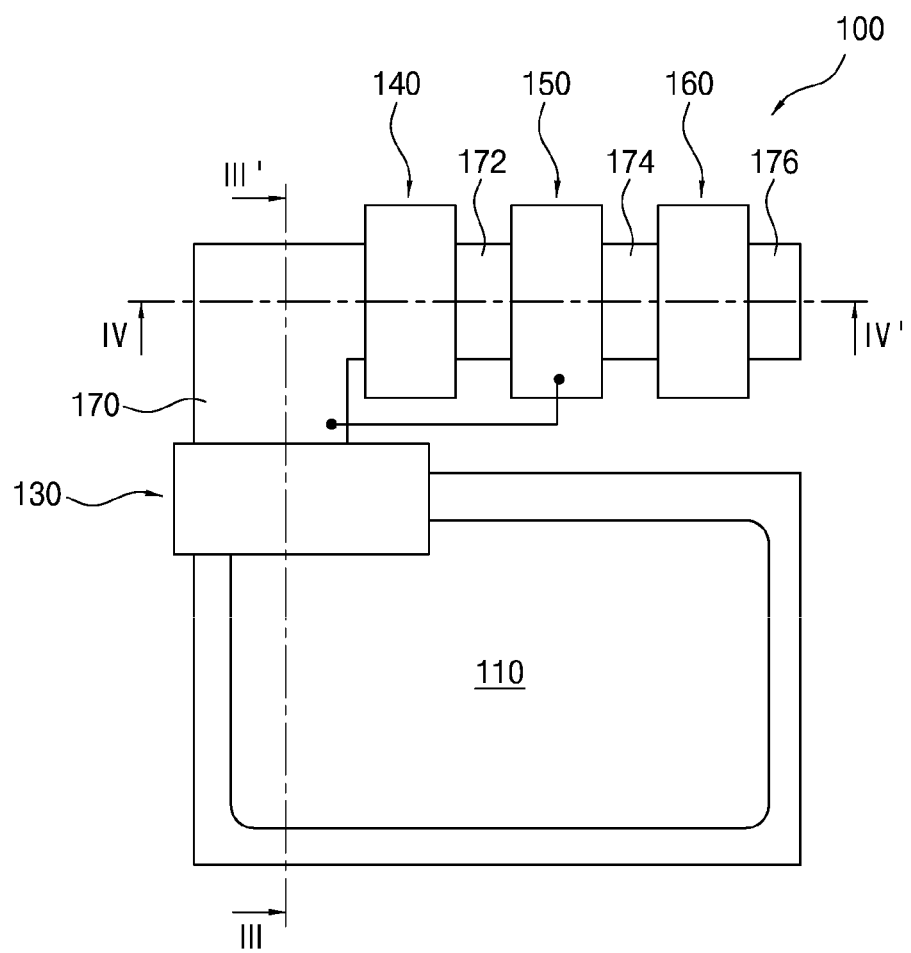
FIG. 1 is a plan view illustrating an image sensor in accordance with an exemplary embodiment of the present disclosure.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION

Hereinafter, embodiments of the present invention are described in more detail with reference to the accompanying drawings. However, the present invention is not limited to the embodiments described below and is implemented in various other forms. Embodiments below are not provided to fully complete the present invention but rather are provided to fully convey the range of the present invention to those skilled in the art.

In the specification, when one component is referred to as being on or connected to another component or layer, it can be directly on or connected to the other component or layer, or an intervening component or layer may also be present. Unlike this, it will be understood that when one component is referred to as directly being on or directly connected to another component or layer, it means that no intervening component is present. Also, though terms like a first, a second, and a third are used to describe various regions and layers in various embodiments of the present invention, the regions and the layers are not limited to these terms.

Terminologies used below are used to merely describe specific embodiments, but do not limit the present invention. Additionally, unless otherwise defined here, all the terms including technical or scientific terms, may have the same meaning that is generally understood by those skilled in the art.

Embodiments of the present invention are described with reference to schematic drawings of ideal embodiments. Accordingly, changes in manufacturing methods and/or allowable errors may be expected from the forms of the drawings. Accordingly, embodiments of the present invention are not described being limited to the specific forms or areas in the drawings, and include the deviations of the forms. The areas may be entirely schematic, and their forms may not describe or depict accurate forms or structures in any given area, and are not intended to limit the scope of the present invention.

Figure 2:
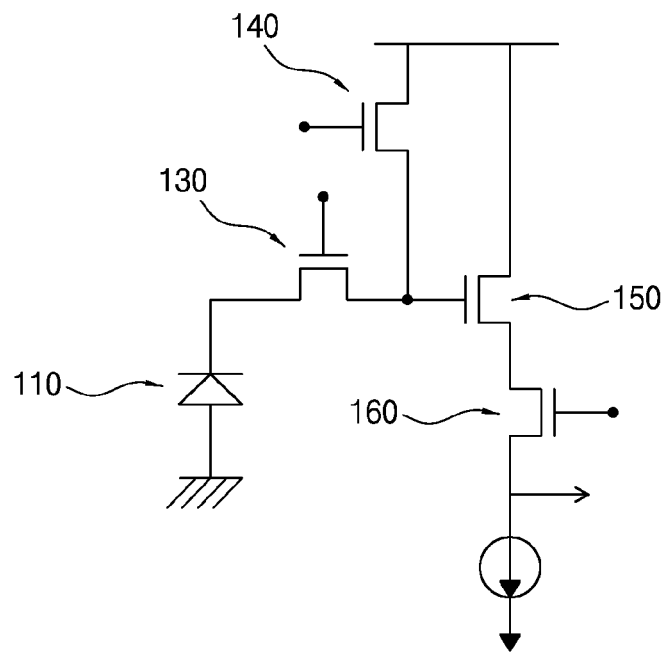
FIG. 2 is a circuit diagram illustrating the image sensor as shown in FIG. 1.
Figure 3:
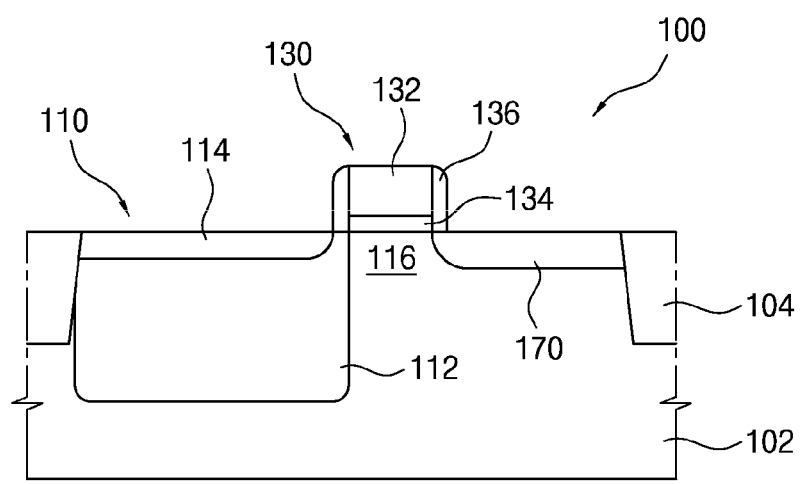
FIG. 3 is a cross-sectional view taken along line III-III' as shown in FIG. 1.
Figure 4:
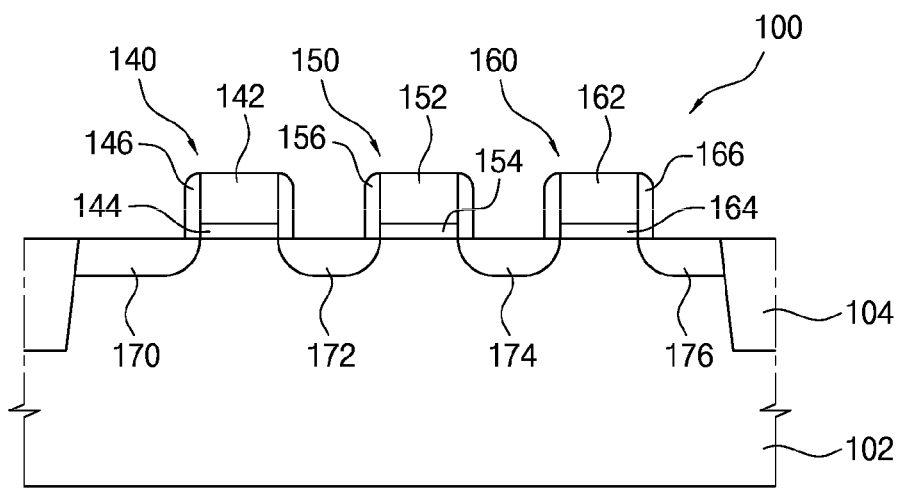
FIG. 4 is a cross-sectional view taken along line IV-IV' as shown in FIG. 1.

FIG. 1 is a plan view illustrating an image sensor in accordance with an exemplary embodiment of the present disclosure, FIG. 2 is a circuit diagram illustrating the image sensor as shown in FIG. 1, FIG. 3 is a cross-sectional view taken along line III-III' as shown in FIG. 1, and FIG. 4 is a cross-sectional view taken along line IV-IV' as shown in FIG. 1.

Referring to FIGS. 1 to 4, an image sensor 100, in accordance with an exemplary embodiment of the present disclosure, may include a photodiode 110 formed in a substrate 102, and transistors 130, 140, 150 and 160 formed on the substrate 102 and electrically connected with the photodiode 110.

The photodiode 110 may include a charge accumulation region 112 having a first conductivity type, and a pinning layer 114 formed on the charge accumulation region 112 and having a second conductivity type. For example, the charge accumulation region 112 may be an n-type impurity region, and the pinning layer 114 may be a p-type impurity region.

A first impurity diffusion region 170 may be disposed to be spaced apart from the photodiode 110 by a predetermined distance, and a channel region 116 of a transfer transistor 130 may be disposed between the photodiode 110 and the first impurity diffusion region 170. The first impurity diffusion region 170 may be used as a floating diffusion region, and a gate insulating layer 134 and a gate electrode 132 of the transfer transistor 130 may be disposed on the channel region 116.

Further, a reset transistor 140, a source follower transistor 150 and a select transistor 160 may be formed on the substrate 102. The reset transistor 140, the source follower transistor 150 and the select transistor 160 may include gate insulating layers 144, 154 and 164, and gate electrodes 142, 152 and 162, respectively. Further, second, third and fourth impurity regions 172, 174 and 176 used as source/drain regions of the reset transistor 140, the source follower transistor 150 and the select transistor 160 may be formed in surface portions of the substrate 102 adjacent to the gate electrodes 142, 152 and 162. For example, the second impurity region 172 may be disposed between the reset transistor 140 and the source follower transistor 150, the third impurity region 174 may be disposed between the source follower transistor 150 and the select transistor 160, and the fourth impurity region 176 may be disposed on one side of the select transistor 160. Spacers 136, 146, 156 and 166 may be formed on side surfaces of the gate electrodes 132, 142, 152 and 162, and a device isolation region 104 may be formed in the substrate 102 in order to define an active region of the image sensor 100.

The first impurity diffusion region 170 may be electrically connected with the gate electrode 152 of the source follower transistor 150, and the select transistor 160 may be electrically connected with an output signal line. The second impurity diffusion region 172 may be used as a common drain of the reset transistor 140 and the source follower transistor 150 and may be electrically connected to Vdd power source. The third impurity diffusion region 174 may be used as source/drain regions of the source follower transistor 150 and the select transistor 160, and the fourth impurity diffusion region 176 may be used as a source region of the select transistor 160 and may be electrically connected with the output signal line.

Charges, e.g., electrons, accumulated in the photodiode 110 may be transferred to the first impurity diffusion region 170 in an ON state of the transfer transistor 130, and a voltage signal based on the transferred charges may be amplified by the source follower transistor 150 connected to the first impurity diffusion region 170. The amplified voltage signal may be output through the output signal line in an ON state of the select transistor 160, and the first impurity diffusion region 170 may be reset in an ON state of the reset transistor 140.

In accordance with an exemplary embodiment of the present disclosure, the gate insulating layer 154, for example, a silicon oxide layer, of the source follower transistor 150 may include fluorine. The fluorine can couple with dangling bonds of the gate insulating layer 154 and trap sites of the gate insulating layer 154 may thus be removed. As a result, the flicker noise that may be generated by the dangling bonds of the gate insulating layer 154 of the source follower transistor 150 may be reduced.

The fluorine may be implanted into the gate electrode 152 of the source follower transistor 150 by an ion implantation process and may be diffused into the gate insulating layer 154 of the source follower transistor 150 by a subsequent heat treatment process.

Meanwhile, it is preferable that the gate insulating layers 134, 144 and 164 of the remaining transistors, i.e., the transfer transistor 130, the reset transistor 140 and the select transistor 160 except the source follower transistor 150 do not include fluorine. This is because the cause of the flicker noise is the dangling bonds of the gate insulating layer 154 of the source follower transistor 150. In addition, when the fluorine is introduced into the gate insulating layers 134, 144 and 164 of the remaining transistors 130, 140 and 160, the overall electrical characteristics of the image sensor 100 may be changed. Thus, it is preferable to selectively implant fluorine only into the gate insulating layer 154 of the source follower transistor 150 so that the flicker noise is reduced without changing the electrical characteristics of the image sensor 100.

Figure 5:
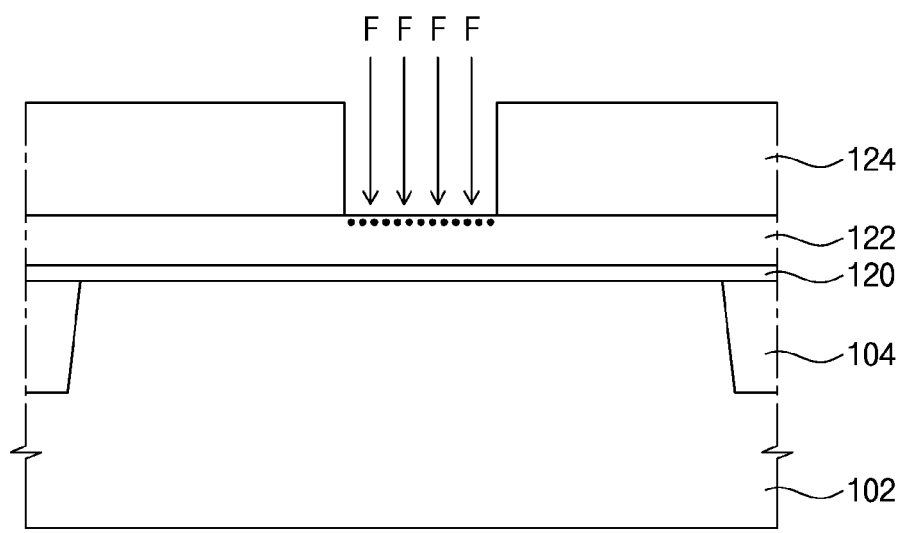
FIGS. 5 to 7 are cross-sectional views illustrating a method of manufacturing the image sensor as shown in FIG. 1.
Figure 6:
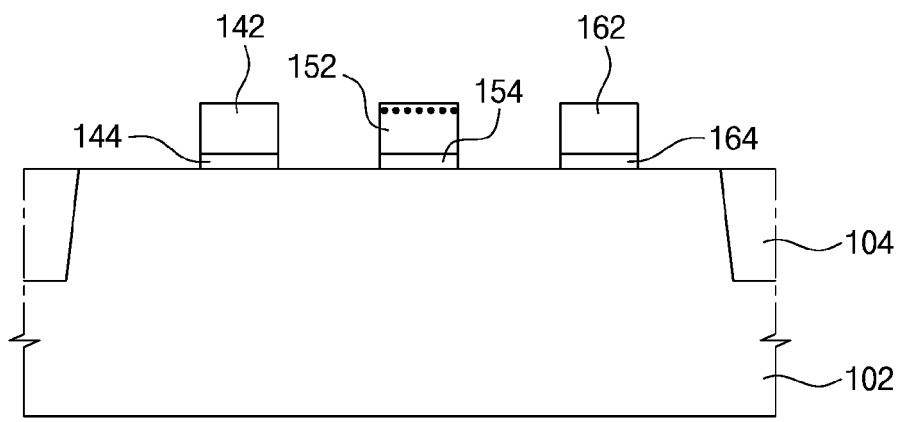
Figure 7:
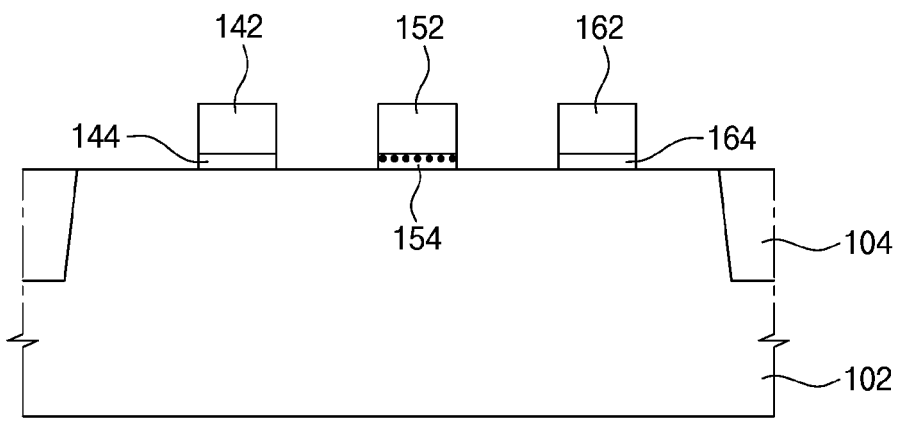

FIGS. 5 to 7 are cross-sectional views illustrating a method of manufacturing the image sensor as shown in FIG. 1. Hereinafter, a method of manufacturing the image sensor 100 in accordance with an exemplary embodiment of the present disclosure will be described with reference to the accompanying figures.

First, a photodiode 110 may be formed in a substrate 100 by an ion implantation process. For example, a p-type substrate may be used as the substrate 102, and a photodiode 110 including an n-type charge accumulation region 112 and a p-type pinning layer 114 may be formed in the substrate 102 by an ion implantation process.

Then, as shown in FIG. 5, an insulating layer 120, e.g., a silicon oxide layer, may be formed on the substrate 102, and a conductive layer 122, e.g., a polysilicon layer doped with an n-type impurities, may be formed on the insulating layer 120. In embodiments, the insulating layer 120 may be formed by a thermal oxidation process, and the conductive layer 122 may be formed by a low pressure chemical vapor deposition process.

An ion implantation mask 124 may be formed on the conductive layer 122. A photoresist pattern formed by a photolithography process may be used as the ion implantation mask 124. The ion implantation mask 124 may expose a portion of the conductive layer 122 where a gate electrode 152 of a source follower transistor 150 will be formed. Then, fluorine ions may be implanted into the portion of the conductive layer 122 exposed by the ion implantation mask 124 by an ion implantation process. The ion implantation mask 124 may be removed by an ashing or stripping process after performing the fluorine ion implantation process.

Referring to FIG. 6, gate electrodes 132, 142, 152 and 162 and gate insulating layers 134, 144, 154 and 164 of a transfer transistor 130, a reset transistor 140, a source follower transistor 150 and a select transistor 160 may be formed by patterning the conductive layer 122 and the insulating layer 120. At this time, because the fluorine ions are selectively implanted only into the portion of the conductive layer 122 where the gate electrode 152 of the source follower transistor 150 is to be formed, the gate electrodes 132, 142 and 162 of the remaining transistors 130, 140 and 160 do not include fluorine.

Referring to FIG. 7, a heat treatment process may be performed so as to diffuse the ion-implanted fluorine from the gate electrode 152 into the gate insulating layer 154 of the source follower transistor 150. Further, the fluorine ions may be coupled with dangling bonds in the gate insulating layer 154 of the source follower transistor 150, and trap sites in the gate insulating layer 154 may be removed. Particularly, as described above, because the heat treatment process is performed after patterning the conductive layer 122 and the insulating layer 120, the diffusion of fluorine into the remaining transistors 130, 140 and 160 except the source follower transistor 150 may be prevented.

Then, gate spacers 136, 146, 156 and 166 may be formed on side surfaces of the gate electrodes 132, 142, 152 and 162, and first to fourth impurity diffusion regions 170, 172, 174 and 176 may be formed in surface portions of the substrate 102 adjacent to the gate electrodes 132, 142, 152 and 162 by an ion implantation process and a heat treatment process. For example, n-type impurities may be implanted into the surface portions of the substrate 102 in order to form the first to fourth impurity diffusion regions 170, 172, 174 and 176, and a heat treatment process may then be performed to activate the implanted impurities.

Alternatively, the ion-implanted fluorine may be diffused into the gate insulating layer 154 of the source follower transistor 150 by the heat treatment process for activating the implanted impurities. In such case, the heat treatment process after patterning the conductive layer 122 and the insulating layer 120 may be omitted.

Figure 8:
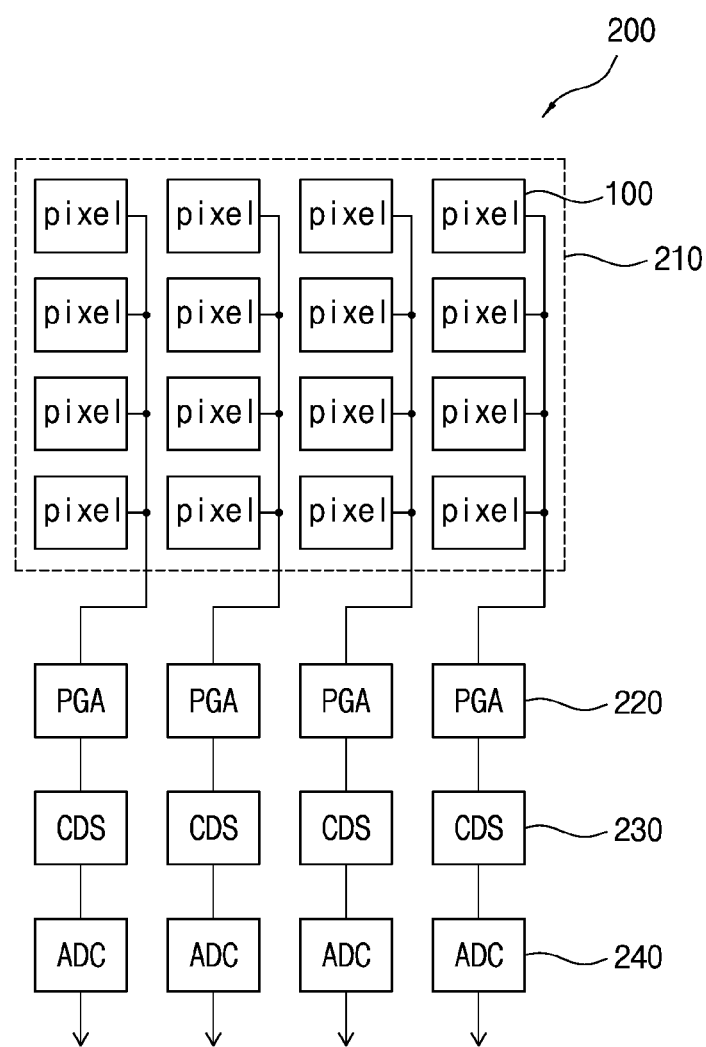
FIG. 8 is a schematic view illustrating an image sensor in accordance with another exemplary embodiment of the present disclosure.

FIG. 8 is a schematic view illustrating an image sensor in accordance with another exemplary embodiment of the present disclosure.

Referring to FIG. 8, an image sensor 200, in accordance with another exemplary embodiment of the present disclosure, may include a pixel array 210 including a plurality of pixel regions 100 arranged in rows and columns, programmable gain amplifiers (PGAs) 220 connected with the pixel array 210, correlated double sampling (CDS) circuits 230 connected with the PGAs 220, and analog digital converters (ADCs) 240 connected with the CDS circuits 230. Though not shown in FIG. 8, the ADCs 240 may be connected with a digital signal processor (DSP).

Each of the pixel regions 100 may have substantially the same configuration as the image sensor 100 already described with reference to FIGS. 1 to 4. Thus, detailed descriptions of the pixel regions 100 will be omitted.

The PGAs 220 may be connected with the pixel regions 100 of the pixel array 210. For example, as shown in FIG. 8, the PGAs 220 may be connected with pixel columns of the pixel array 210, respectively. That is, select transistors of pixel regions 100 constituting each pixel column may be connected with each PGA 220 by an output signal line. The PGAs 220 may amplify the output signals of the pixel array 210, and the CDS circuits 230 may perform the CDS on the reset signals of the pixel array 210 and the output signals amplified by the PGAs 220.

Though not shown in FIG. 8, the PGAs 220 and the CDS circuits 230 may include amplifying transistors for amplifying input signals. Often, when dangling bonds are formed in gate insulating layers of the amplifying transistors of the PGAs 220 and/or the CDS circuits 230, flickering column noise may be generated. In accordance with the present exemplary embodiment, fluorine ions may be introduced into the gate insulating layers of the amplifying transistors of the PGAs 220 and CDS circuits 230, and the flickering column noise of the image sensor 100 may thus be reduced.

Particularly, the amplifying transistors of the PGAs 220 and CDS circuits 230 may be simultaneously formed with transfer transistors 130, reset transistors 140, source follower transistors 150 and select transistors 160 of the pixel regions 100, and the fluorine may be introduced into gate insulating layers of the amplifying transistors and the gate insulating layers 154 of the source follower transistors 150 by an ion implantation process and a heat treatment process.

In accordance with the exemplary embodiments of the present disclosure as described above, an image sensor 100 may include a photodiode 110 formed in a substrate 102, and transistors 130, 140, 150 and 160 formed on the substrate 102 and electrically connected with the photodiode 110. Fluorine may be introduced in a gate insulating layer 154 of a source follower transistor 150 by an ion implantation process and a heat treatment process. The fluorine may be coupled with dangling bonds in the gate insulating layer 154, and flicker noise of the image sensor 100 may thus be reduced.

Further, the fluorine may be introduced in gate insulating layers of amplifying transistors of a PGA 220 and/or a CDS circuit 230 connected with a select transistor 160, and flickering column noise of the image sensor 100 may thus be reduced.

Although the image sensor 100 and the method of manufacturing the same have been described with reference to specific embodiments, they are not limited thereto. Therefore, it will be readily understood by those skilled in the art that various modifications and changes can be made thereto without departing from the spirit and scope of the present disclosure defined by the appended claims.

The invention claimed is:

1. An image sensor comprising:
    a photodiode disposed in a substrate; and
    a plurality of transistors disposed on the substrate and electrically connected with the photodiode;
    wherein the plurality of transistors comprises a source follower transistor, a select transistor and at least one amplifying transistor electrically connected with the select transistor, and
    gate insulating layers of the source follower transistor and the at least one amplifying transistor comprise fluorine.

2. The image sensor of claim 1, wherein gate insulating layers of the transistors other than the source follower transistor and the at least one amplifying transistor do not comprise fluorine.

3. The image sensor of claim 1, wherein the at least one amplifying transistor is included in a programmable gain amplifier.

4. The image sensor of claim 1, wherein the at least one amplifying transistor is included in a correlated double sampling circuit.

5. A method of manufacturing an image sensor, the method comprising:
    forming a photodiode in a substrate; and
    forming a plurality of transistors on the substrate, each of the plurality of transistors being electrically connected with the photodiode;
    wherein the plurality of transistors comprises a source follower transistor, a select transistor and at least one amplifying transistor electrically connected with the select transistor, and
    gate insulating layers of the source follower transistor and the at least one amplifying transistor comprise fluorine.

6. The method of claim 5, wherein gate insulating layers of the transistors other than the source follower transistor and the at least one amplifying transistor do not comprise fluorine.

7. The method of claim 5, wherein the at least one amplifying transistor is included in a programmable gain amplifier.

8. The method of claim 5, wherein the at least one amplifying transistor is included in a correlated double sampling circuit.

9. A method of manufacturing an image sensor, the method comprising:
    forming a photodiode in a substrate;
    forming an insulating layer on the substrate;
    forming a conductive layer on the insulating layer;
    selectively implanting fluorine into portions of the conductive layer; and forming gate electrodes and gate insulating layers of a plurality of transistors by patterning the conductive layer and the insulating layer;

wherein the plurality of transistors is electrically connected with the photodiode and comprises a source follower transistor, a select transistor and at least one amplifying transistor electrically connected with the select transistor, and the portions of the conductive layer into which the fluorine is implanted are formed into gate electrodes of the source follower transistor and the at least one amplifying transistor.

10. The method of claim 9, wherein the fluorine is selectively implanted only into portions of the conductive layer where the gate electrodes of the source follower transistor and the at least one amplifying transistor are to be formed.

11. The method of claim 9, further comprising performing a heat treatment to diffuse the implanted fluorine into gate insulating layers of the source follower transistor and the at least one amplifying transistor.

12. The method of claim 9, further comprising forming impurity diffusion regions in surface portions of the substrate adjacent to the gate electrodes.

13. The method of claim 12, wherein the forming impurity diffusion regions comprises:

implanting impurities into the surface portions of the substrate; and performing a heat treatment to activate the implanted impurities;

wherein the implanted fluorine is diffused into gate insulating layers of the source follower transistor and the at least one amplifying transistor during the heat treatment.

14. The method of claim 9, wherein the at least one amplifying transistor is included in a programmable gain amplifier.

15. The method of claim 9, wherein the at least one amplifying transistor is included in a correlated double sampling circuit.

* * * * *